(12) United States Patent
Wang

(10) Patent No.: US 8,601,974 B2
(45) Date of Patent: Dec. 10, 2013

(54) CONVEYING DEVICE HAVING CARRIER WITH REVOLVING FRAME AND DEPOSITION DEVICE USING SAME

(75) Inventor: Chung-Pei Wang, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 245 days.

(21) Appl. No.: 13/112,242

(22) Filed: May 20, 2011

(65) Prior Publication Data

US 2012/0067279 A1   Mar. 22, 2012

(30) Foreign Application Priority Data

Sep. 21, 2010   (TW) .............................. 99131902 A

(51) Int. Cl.
 *B05B 13/02*   (2006.01)
 *B05C 5/00*    (2006.01)
 *B05C 13/02*   (2006.01)
 *B05D 1/02*    (2006.01)
 *B65G 7/08*    (2006.01)

(52) U.S. Cl.
USPC ........... 118/319; 118/313; 118/500; 118/502; 118/503; 118/729; 427/425; 105/109; 198/310; 198/467; 198/791; 414/758

(58) Field of Classification Search
USPC .................. 118/313, 319, 500, 729; 427/425; 105/109; 198/310, 467, 791; 414/758
See application file for complete search history.

(56) References Cited

U.S. PATENT DOCUMENTS

| | | | | |
|---|---|---|---|---|
| 3,046,157 A | * | 7/1962 | Nyman ............................ | 427/67 |
| 3,517,644 A | * | 6/1970 | Baer .............................. | 118/716 |
| 3,606,162 A | * | 9/1971 | Lehman ......................... | 239/227 |
| 3,703,881 A | * | 11/1972 | Ruf et al. ....................... | 118/712 |
| 3,889,632 A | * | 6/1975 | Brunner et al. ................ | 118/730 |
| 4,148,262 A | * | 4/1979 | Eichinger ...................... | 105/131 |
| 4,909,701 A | * | 3/1990 | Hardegen et al. ........... | 414/744.5 |
| 5,029,555 A | * | 7/1991 | Dietrich et al. ................ | 118/730 |
| 5,032,052 A | * | 7/1991 | Swain ....................... | 414/222.03 |
| 5,037,672 A | * | 8/1991 | Daussan et al. ................ | 427/236 |
| 5,104,682 A | * | 4/1992 | Nakahama et al. ............ | 427/481 |
| 5,182,003 A | * | 1/1993 | Maass et al. ............. | 204/298.23 |
| 5,651,820 A | * | 7/1997 | Ogasawara et al. ............. | 118/66 |
| 5,686,148 A | * | 11/1997 | Suzuki .......................... | 427/444 |
| 5,731,038 A | * | 3/1998 | Ogasawara ................... | 427/346 |
| 5,743,962 A | * | 4/1998 | Ogasawara et al. ........... | 118/643 |
| 2002/0023585 A1 | * | 2/2002 | Sashihara ..................... | 118/313 |
| 2003/0190420 A1 | * | 10/2003 | Chappa et al. ................ | 427/240 |
| 2012/0042824 A1 | * | 2/2012 | Wang ............................ | 118/503 |

* cited by examiner

*Primary Examiner* — Dah-Wei Yuan
*Assistant Examiner* — Karl Kurple
(74) *Attorney, Agent, or Firm* — Altis Law Group, Inc.

(57) ABSTRACT

A conveying device for a deposition device includes a transport device and a carrier. The transport device includes a main body, two wheels, a connection shaft, and a first bevel gear. The connection shaft is mounted on the main body. The two wheels are mounted on two opposite ends of the connection shaft. The first bevel gear is sleeved on the connection shaft. The carrier includes a revolving frame, a rotating shaft, a second bevel gear, and at least one carrying bar. The rotating shaft is mounted on the revolving frame. The second bevel gear is sleeved on one end of the rotating shaft and meshed with the first bevel gear. The revolving frame rotates relative to the rotating shaft. The at least one carrying bar is mounted on the revolving frame and driven by the rotating shaft to rotate. Each carrying bar includes supporting elements for carrying workpieces.

9 Claims, 5 Drawing Sheets

CONVEYING DEVICE HAVING CARRIER WITH REVOLVING FRAME AND DEPOSITION DEVICE USING SAME

BACKGROUND

1. Technical Field

The disclosure relates to conveying devices, and particularly to a conveying device utilized in a deposition device.

2. Description of the Related Art

As the shapes of electronic devices, become more specific. The thicknesses of films formed on different surfaces of the electronic devices are hard to make uniform.

Therefore, it is desired to provide a new deposition device which can overcome the above-mentioned limitations.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings. It should be noted that references to "an" or "one" embodiment in this disclosure are not necessarily to the same embodiment, and such references mean at least one.

Figure 1:
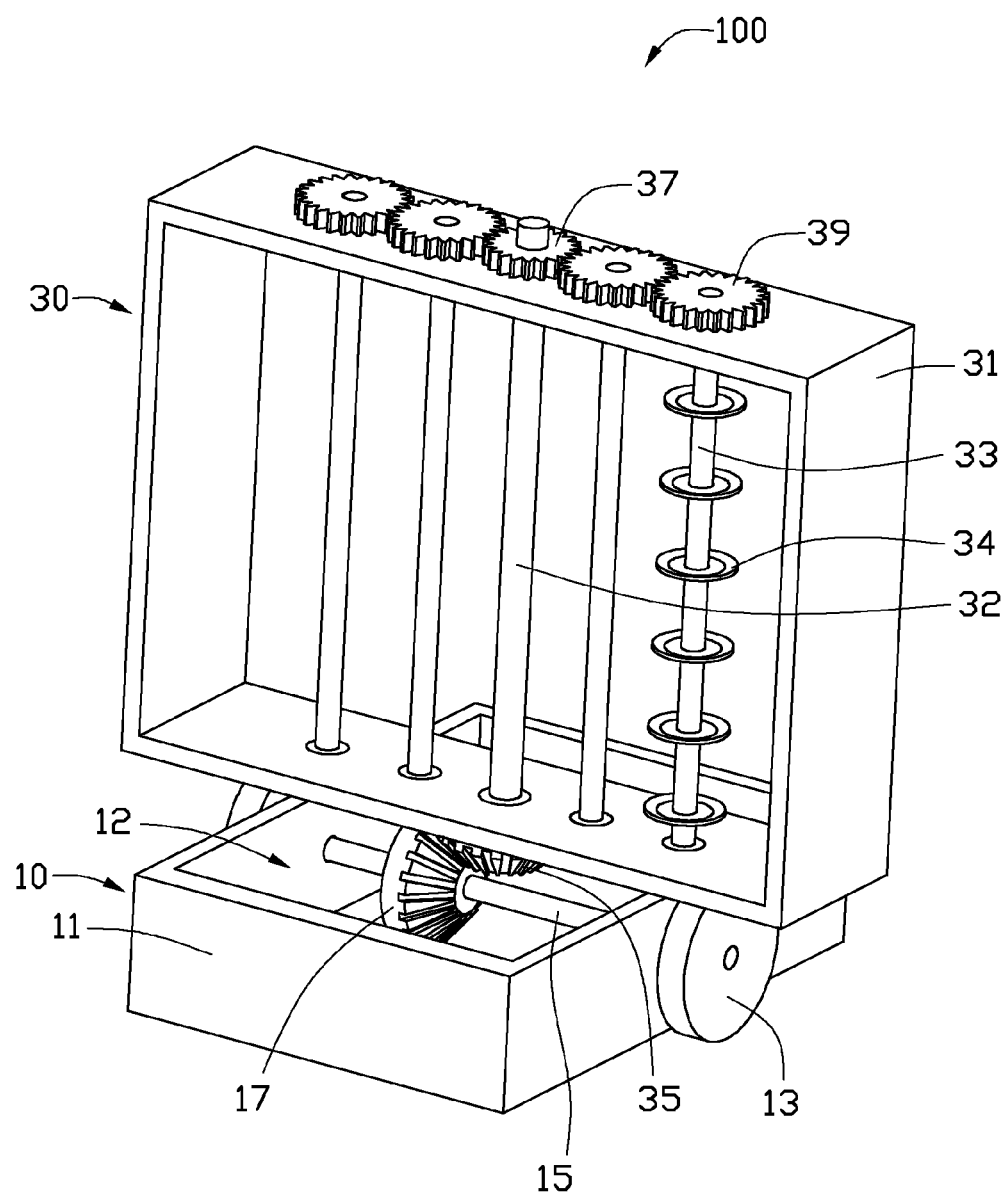
FIG. 1 is a schematic view of a conveying device in accordance with a first embodiment of the disclosure, the conveying device including a revolving frame.
Figure 2:
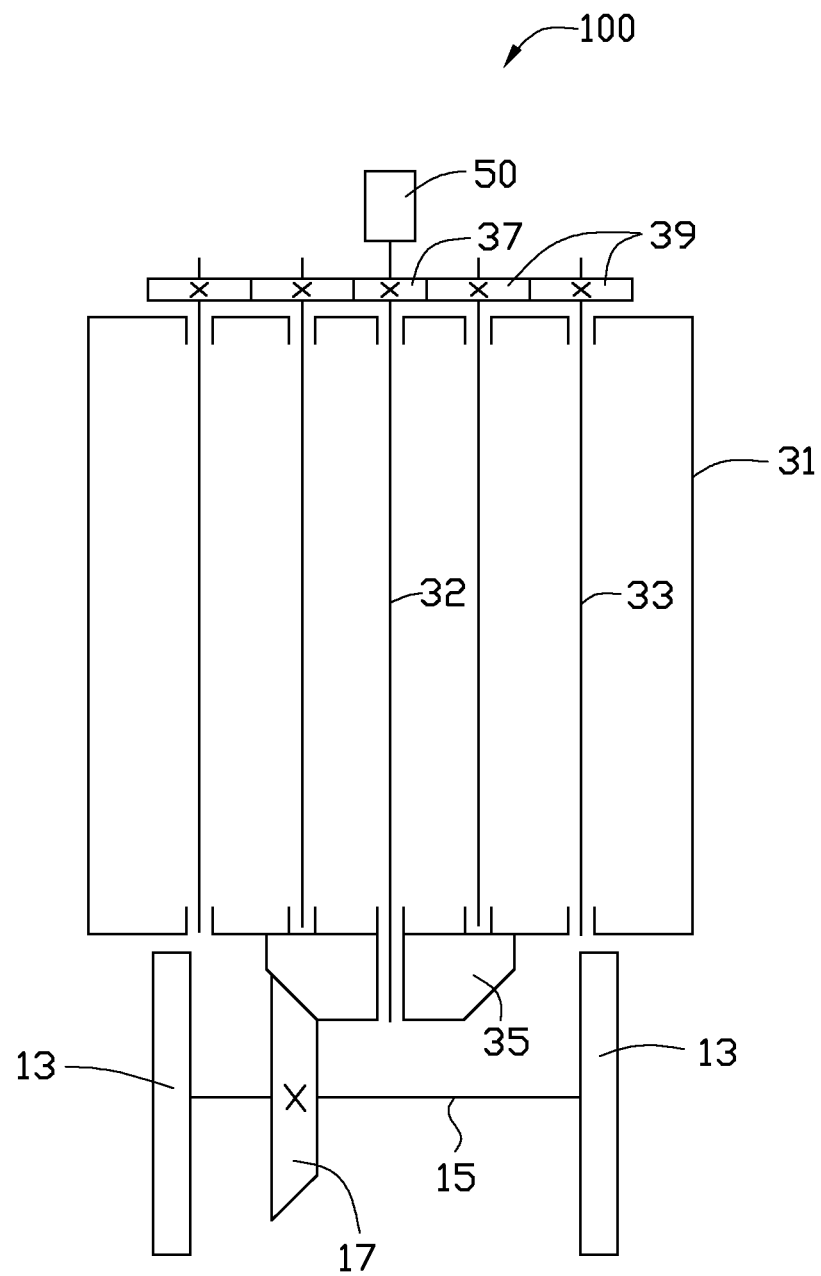
FIG. 2 is a functional diagram of the conveying device in FIG. 1.
Figure 3:
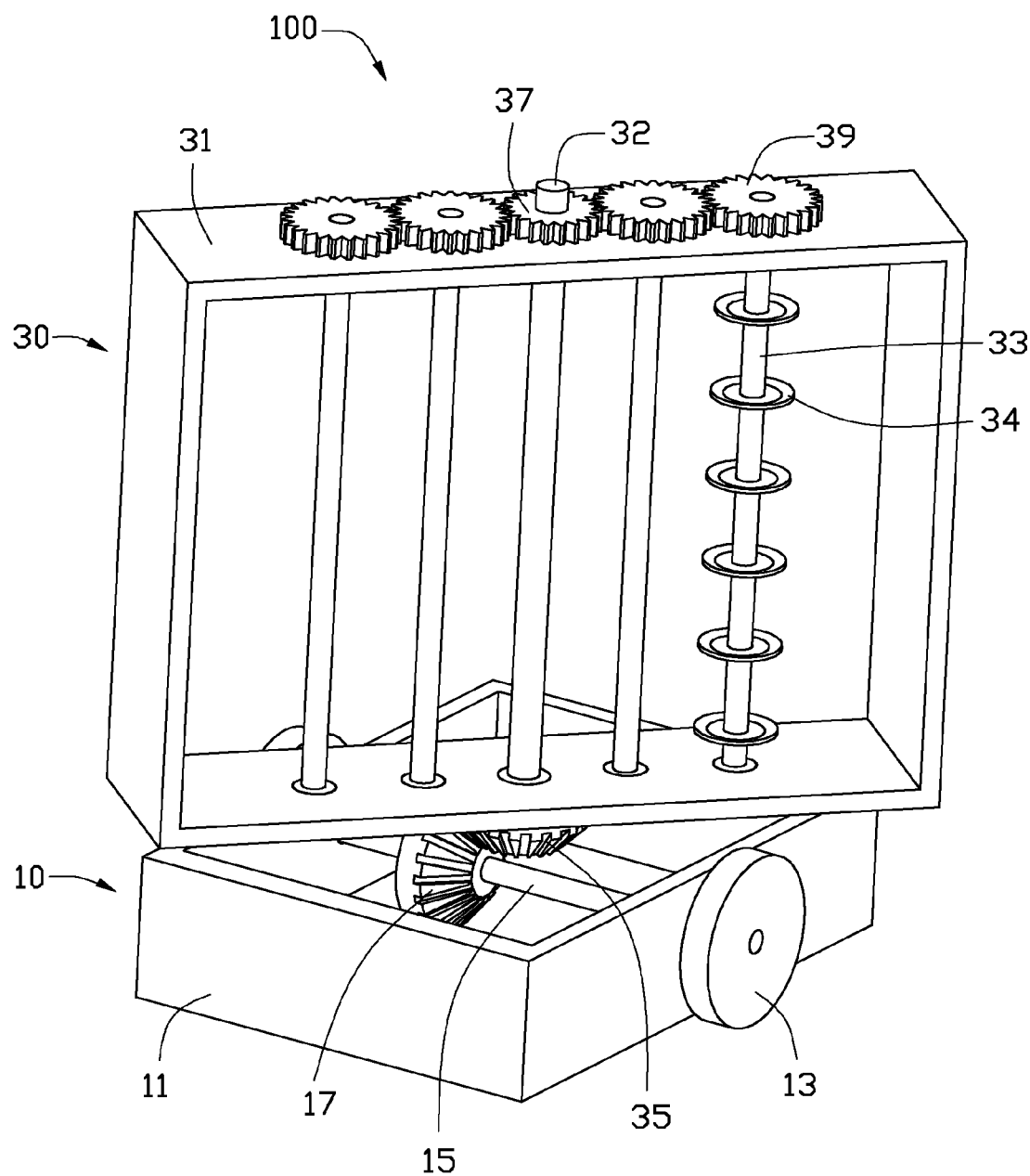
FIG. 3 is a schematic view the conveying device in FIG. 1, the revolving frame rotating at an angle.

Referring to FIGS. 1-3, a conveying device 100 for a deposition device in accordance with a first embodiment of the disclosure includes a transport device 10 and a carrier 30. The carrier 30 is mounted on the transport device 10. The carrier 30 is configured for supporting a number of workpieces.

The transport device 10 includes a main body 11, two wheels 13, a connection shaft 15 and a first bevel gear 17.

The main body 11 is a substantially hollow cuboid and defines a cavity 12. The connection shaft 15 passes through two opposite sidewalls of the main body 11. The two wheels 13 are respectively positioned on two ends of the connection shaft 15. The first bevel gear 17 is sleeved on the connection shaft 15 and is received in the cavity 12 of the main body 11. The main body 11 is movable according to the at least two wheels 13 and the connection shaft 15.

The carrier 30 includes a revolving frame 31, a number of carrying bars 33, a second bevel gear 35, a rotating shaft 32, a drive gear 37 and a number of slave gears 39. The rotating shaft 32 passes through the center portions of two opposite sidewalls of the revolving frame 31. The rotating shaft 32 is perpendicular to the connection shaft 15. The second bevel gear 35 is sleeved on one end of the rotating shaft 32 and positioned on the outside of the revolving frame 31. The second bevel gear 35 is meshed with the first bevel gear 17. The drive gear 37 is sleeved on another end of the rotating shaft 32 and positioned on the outside of the revolving frame 31. The revolving frame 31 can rotate relative to the rotating shaft 32.

The carrying bars 33 pass through the two opposite sidewalls of the revolving frame 31 and are arranged at two sides of the rotating shaft 32. The carrying bars 33 and the rotating shaft 32 are parallel to each other. Each slave gear 39 is sleeved on one end of a corresponding carrying bar 33 and positioned on the outside of the revolving frame 31. Each two neighboring slave gears 39 are meshed with each other. The two slave gears 39 close to the drive gear 37 are meshed with the drive gear 37. As a result, the carrying bars 33 and the rotating shaft 32 are capable of rotating synchronously. Each of the carrying bars 33 includes a number of supporting elements 34 for carrying a number of workpieces. In this embodiment, the carrier 33 includes four carrying bars 33. Each of the carrying bars 33 includes six supporting elements 34. The revolving frame 31 is rectangular. Each of the carrying bars 32 is cylindrical. The four carrying bars 33 are regularly located at two sides of the rotating shaft 32. The distance between two adjacent carrying bars and a distance between the rotating shaft 32 and a carrying bar 33 close to the rotating shaft 32 are equal to each other. The rotating shaft 32 and the four carrying bars 33 are substantially located in the same plane.

In other embodiments, the four carrying bars 33 can also be arranged around the rotating shaft 32. The rotating shaft 32 and the carrying bars 33 can also be connected to each other through a belt or a chain.

The conveying device 100 further includes a drive module 50. The drive module 50 is coupled to the rotating shaft 32. The velocity of the conveying device 100 and the rotation velocity of the carrier 30 can be adjusted according to the specific process.

Figure 4:
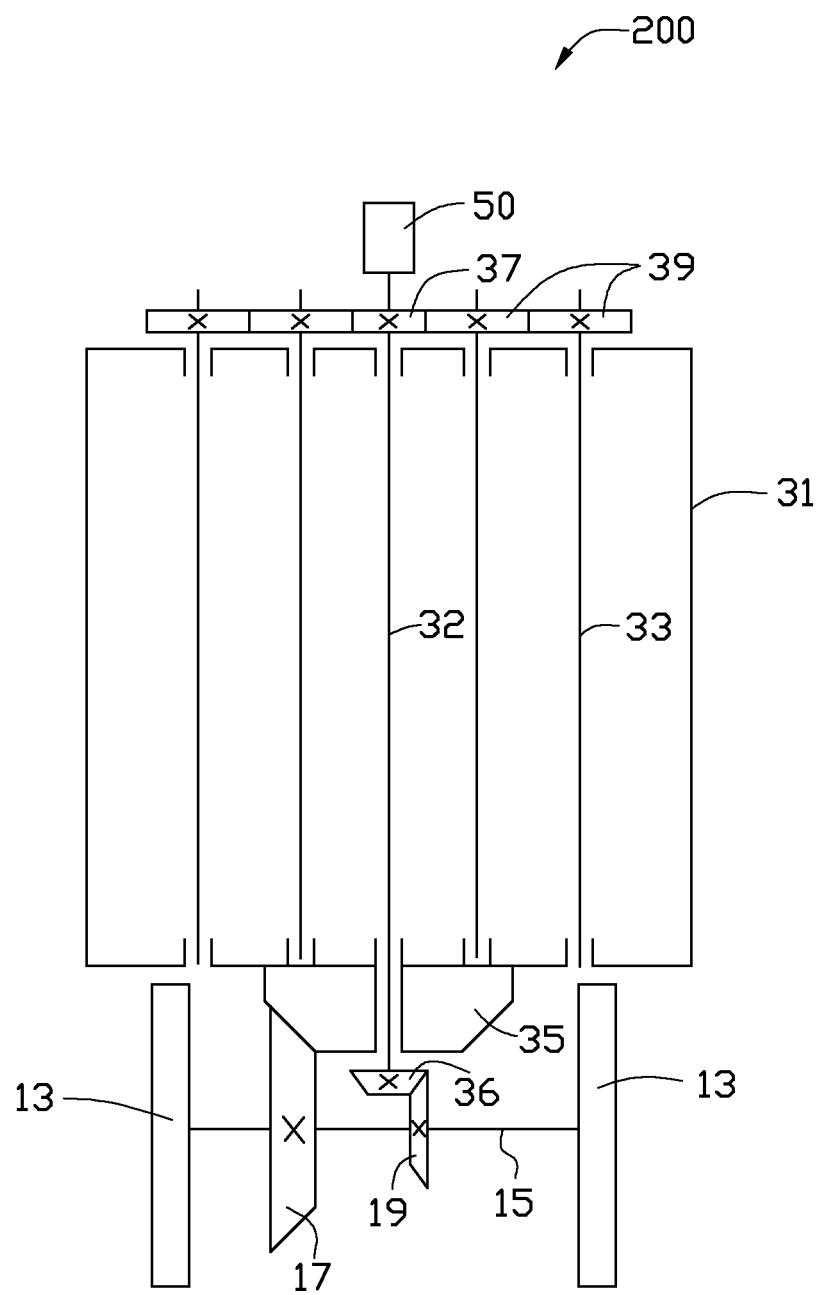
FIG. 4 is a functional diagram of a conveying device in accordance with a second embodiment of the disclosure.

Referring to FIG. 4, a conveying device 200 in accordance with a second embodiment of the disclosure is similar to the conveying device 100 of FIGS. 1 to 3, except that a third bevel gear 19 is sleeved on the connection shaft 15 and a fourth bevel gear 36 is sleeved on the rotating shaft 32. The third bevel gear 19 is located between the two wheels 13 and is close to the first bevel gear 17. The fourth bevel gear 36 is meshed with the third bevel gear 19.

When the conveying device 200 is moving, the first bevel gear 17 drives the second bevel gear 35 to rotates. The revolving frame 31 rotates relative to the rotating shaft 32 and each of the four carrying bars 33 rotates relative to the axis thereof under the driving of the second bevel gear 35. A diameter of the third bevel gear 19 is smaller than that of the first bevel gear 17, and a diameter of the fourth bevel 36 is smaller than that of the second bevel gear 35. The rotation velocity of each carrying bar 33 can be finely adjusted by selecting the third bevel gear 19 and the fourth bevel gear 36 instead of the first bevel gear 17 and the second bevel gear 35. The drive module 50 can also be positioned in the main body 11 and be coupled to the connection shaft 15.

Figure 5:
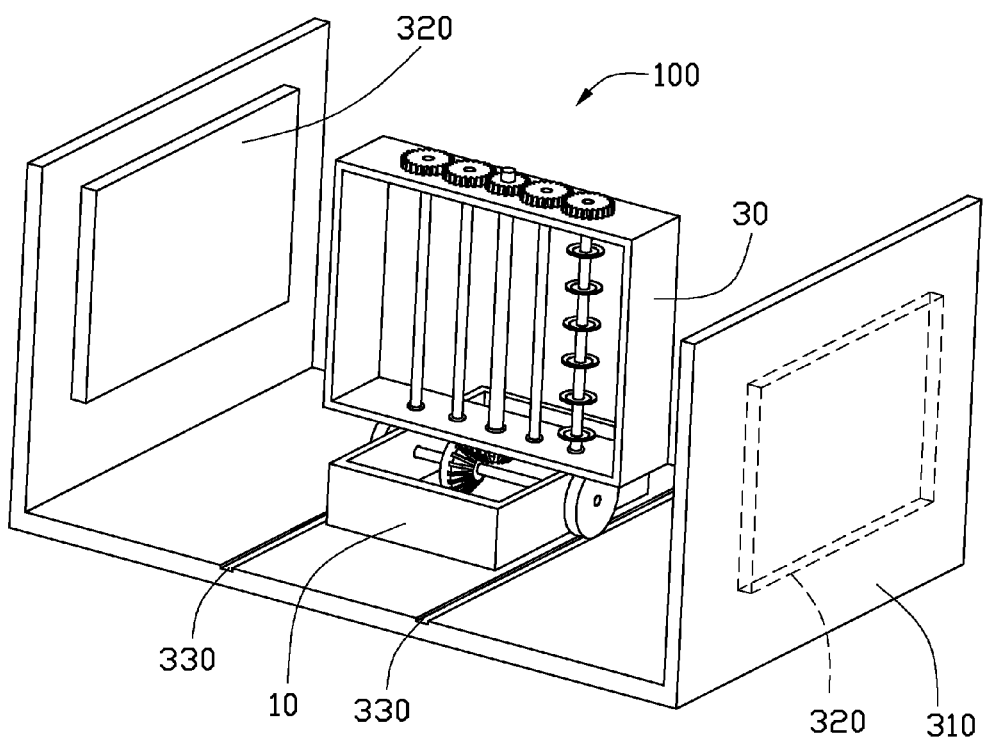
FIG. 5 is a schematic view of one embodiment of a deposition device utilizing the conveying device in FIG. 1.

Referring to FIG. 5, one embodiment of a deposition device 300 utilizing a conveying device 100 includes a chamber 310. The conveying device 100 is positioned in the chamber 310.

The chamber 310 is vacuumized. In the embodiment, the deposition device 300 further includes two deposition sources 320 and two tracks 330. The two deposition sources 320 are positioned on two inner surfaces of the chamber 310 and opposite to each other. The two tracks 330 are defined on the bottom of the chamber 310 and are parallel to each other.

The two wheels 13 of the conveying device 100 are matched to the two tracks 330. The conveying device 100 can move in the chamber 310 along the two tracks 330.

The deposition device 300 can further include a plurality of chambers for different processes, such as a buffer chamber, a heating chamber, a deposition chamber, a loading chamber or an unloading chamber. The velocity of the conveying device 100 and the revolving velocity of the revolving frame 31 can be adjusted according to the different process.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A deposition device, comprising:
    a chamber;
    two deposition sources positioned on two inner surfaces of the chamber and opposite to each other;
    two tracks positioned on the bottom of the chamber; and
    a conveying device received in the chamber, comprising:
        a transport device comprising a main body, two wheels, a connection shaft, and a first bevel gear, the connection shaft being mounted on the main body, the two wheels being mounted on two opposite ends of the connection shaft and engaged with the two tracks, the first bevel gear being sleeved on the connection shaft; and
        a carrier comprising a revolving frame, a rotating shaft, a second bevel gear, and at least one carrying bar, the rotating shaft being mounted on the revolving frame, the second bevel gear being sleeved on one end of the rotating shaft and meshed with the first bevel gear, the revolving frame being rotated relative to the rotating shaft, the at least one carrying bar being mounted on the revolving frame and being driven by the rotating shaft to rotate, each of the at least one carrying bar comprising a plurality of supporting elements for carrying workpieces.

2. The deposition device of claim 1, wherein the rotating shaft is perpendicular to the connection shaft, and the at least one carrying bar and the rotating shaft are arranged parallel to each other.

3. The deposition device of claim 1, wherein the main body is a hollow cuboid and defines a cavity, the two wheels are positioned on the outside of the main body, and the first bevel gear is positioned in the cavity.

4. The deposition device of claim 3, wherein the connection shaft passes through two opposite sidewalls of the main body.

5. The deposition device of claim 1, wherein the carrier further comprises a plurality of carrying bars, a drive gear and a plurality of slave gears, the rotating shaft passes through two opposite sidewalk of the revolving frame, the drive gear is sleeved on another end of the rotating shaft, the carrying bars pass through the two opposite sidewalls of the revolving frame and are arranged at two sides of the rotating shaft, each of the slave gears is sleeved on one end of a corresponding one of the carrying bars, each two neighboring slave gears are meshed with each other, and two of the slave gears close to the drive gear are meshed with the drive gear.

6. The deposition device of claim 5, wherein the carrying bars and the rotating shaft are arranged parallel to each other.

7. The deposition device of claim 5, wherein the carrying bars and the rotating shaft are located in a same plane.

8. The deposition device of claim 1, wherein the transport device further comprises a third bevel gear sleeved on the connection shaft, the carrier further comprises a fourth bevel gear sleeved on the rotating shaft, and the third bevel gear is configured to mesh with the fourth bevel gear.

9. The deposition device of claim 8, wherein a diameter of the third bevel gear is smaller than that of the first bevel gear, and a diameter of the fourth bevel gear is smaller than that of the second bevel gear.

* * * * *